(12) United States Patent
Chua et al.

(10) Patent No.: US 7,623,982 B2
(45) Date of Patent: Nov. 24, 2009

(54) METHOD OF TESTING AN ELECTRONIC CIRCUIT AND APPARATUS THEREOF

(75) Inventors: Choon Meng Chua, Singapore (SG); Alfred Cheng Teck Quah, Singapore (SG); Soon Huat Tan, Singapore (SG); Lian Ser Koh, Singapore (SG); Jacob Chee Hong Phang, Singapore (SG)

(73) Assignee: Semicaps Pte Ltd, Singapore (SG)

( * ) Notice: Subject to any disclaimer, the term of this patent is extended or adjusted under 35 U.S.C. 154(b) by 45 days.

(21) Appl. No.: 11/935,401

(22) Filed: Nov. 5, 2007

(65) Prior Publication Data

US 2009/0119042 A1 May 7, 2009

(51) Int. Cl.
*G01R 31/00* (2006.01)
*G01R 27/28* (2006.01)
*G01R 31/14* (2006.01)

(52) U.S. Cl. .................. 702/117; 702/109; 702/189; 324/501; 324/751; 324/765; 703/14; 456/484; 456/489

(58) Field of Classification Search ................. 702/109, 702/117, 189; 324/76.36, 501, 751, 752, 324/765; 703/14; 356/484, 489, 492, 517
See application file for complete search history.

(56) References Cited

U.S. PATENT DOCUMENTS

| | | | | |
|---|---|---|---|---|
| 4,706,018 A | * | 11/1987 | Beha et al. | 324/751 |
| 6,819,125 B1 | * | 11/2004 | Green et al. | 324/750 |
| 6,897,664 B1 | | 5/2005 | Bruce et al. | |
| 7,019,311 B1 | * | 3/2006 | Horn | 250/484.4 |
| 7,206,078 B2 | * | 4/2007 | Pfaff et al. | 356/517 |
| 2008/0238435 A1 | * | 10/2008 | Bockelman et al. | 324/501 |

OTHER PUBLICATIONS

Fritz et al., 'A CAD Coupled Laser Beam Test System for Digital Circuit Failure Analysis', Sep. 1990, IEEE Publication, vol. 13, No. 3, pp. 490-493.*

* cited by examiner

*Primary Examiner*—Edward Raymond
*Assistant Examiner*—Elias Desta
(74) *Attorney, Agent, or Firm*—Steven J. Hultquist; Intellectual Property Technology Law

(57) ABSTRACT

A method of testing an electronic circuit is provided. The method comprises radiating a laser beam onto the electronic circuit, and determining a plurality of samples of a response signal output by the electronic circuit during the period when the laser beam is radiated. The method further comprises accumulating the plurality of samples to generate a value, and generating a test result based on the value.

25 Claims, 12 Drawing Sheets

| No. | Laser Induced Detection Systems | SNR |
|---|---|---|
| 1 | TIVA | 7.9 |
| 2 | Pulsed TIVA with Signal Integration at 1.28 kHz | 109.8 |
| 3 | DReM | 14.7 |
| 4 | Pulsed DReM with Signal Integration at 500 Hz | 136.1 |

Figure 8

METHOD OF TESTING AN ELECTRONIC CIRCUIT AND APPARATUS THEREOF

FIELD OF THE INVENTION

The present invention relates generally to semiconductor processing, and more particularly to a method of testing an electronic circuit, as well as to a respective apparatus.

BACKGROUND OF THE INVENTION

The development of conventional laser induced techniques to detect laser induced effects on integrated circuits have resulted in scanning microscopes becoming useful tools for active fault localization in the area of integrated circuit testing. These conventional laser induced techniques generally involve using a scanned laser beam, typically in the infrared frequency range, to stimulate integrated circuit failures which are sensitive to thermal or carrier stimulations. These techniques have been found to be effective in localizing short circuits or open circuits in the metallization layers and the active regions of integrated circuits. Examples of these techniques include Optical Beam Induced Resistance Change (OBIRCH), Thermal Induced Voltage Alteration (TIVA), Thermal Beam Induced Phenomenon (TBIP), Externally Induced Voltage Alteration (XIVA) and Differential Resistance Measurement (DReM).

However, with the advancement of integrated circuit technology which has typically involved the use of more metallization layers and new low k inter-layer dielectric materials with lower thermal conductivity, the laser coupling efficiency is reduced. As a result, the detection sensitivity of these conventional laser induced techniques is also reduced. Accordingly, in order for these conventional laser induced techniques to remain effective, especially when used for the more advanced integrated circuits, an improvement in their detection sensitivity is needed.

A conventional approach to improve the detection sensitivity of these conventional laser induced techniques is to increase the power of the laser beam used, in order to compensate for the reduced laser coupling efficiency. However, there is a limit on the maximum power of the laser beam which can be used, since there may be potential laser induced damage on the integrated circuit under test when the power of the laser beam used is too high. Accordingly, the improvement in detection sensitivity from using this approach is obtained at the cost of a higher risk of damage to the integrated circuit under test. Therefore, this approach may not be desirable.

Another conventional approach to improve the detection sensitivity of these conventional laser induced techniques is to use a pulsed laser in conjunction with a lock-in amplifier. It has been found that the detection sensitivity is increased by pulsing the laser beam at suitable frequencies, where the noise level is low, in conjunction with the use of the lock-in amplifier for subsequent signal processing.

In order to achieve the desired level of detection sensitivity, it is required in this approach to have accurate calibration and fine control of the lock-in amplifier parameters, such as the time constant, the lock-in frequency and the phase difference between the reference frequency and the frequency of pulsing the laser beam for each scanning speed used. However, accurate calibration and fine control of the lock-in amplifier parameters is typically difficult to achieve in practice. In view of this, this approach is difficult to implement, and therefore, is not used in a real-time integrated circuit testing environment.

SUMMARY OF THE INVENTION

In accordance with one aspect of the invention, a method of testing an electronic circuit is provided. The method includes radiating a laser beam onto the electronic circuit and determining a plurality of samples of a response signal output by the electronic circuit during the period when the laser beam is radiated. The method further includes accumulating the plurality of samples to generate a value, and generating a test result based on the value.

In accordance with another aspect of the invention, an apparatus is provided. The apparatus includes a laser beam source, wherein the laser beam source radiates a laser beam onto the electronic circuit, a control system operable to direct the laser beam source to dwell on a location on the electronic circuit, and a measuring circuit, wherein the measuring circuit determines a plurality of samples of a response signal output by the electronic circuit during the period when the laser beam is radiated. The apparatus further includes a signal processor, wherein the signal processor accumulates the plurality of samples to generate a value, and generates a test result based on the value.

BRIEF DESCRIPTION OF THE DRAWINGS

The foregoing and other advantages of the invention will become apparent upon reading the following detailed description and upon reference to the drawings in which:

FIG. 8 shows a table comparing the performance results of the electronic circuit which was tested in two exemplary embodiments of the invention against the performance results of the electronic circuit which was tested using two conventional methods.

DETAILED DESCRIPTION OF THE INVENTION

Figure 1:
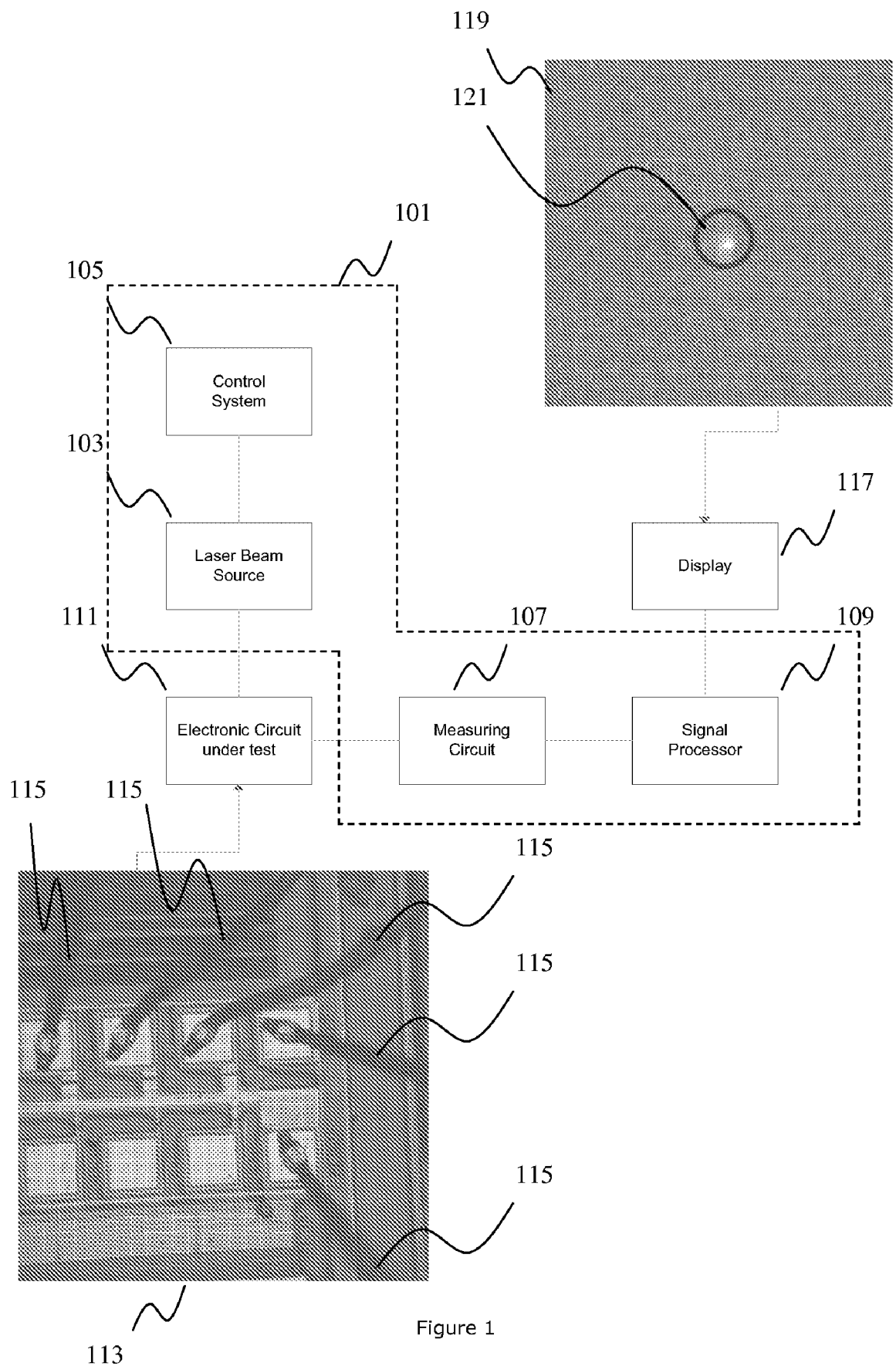
FIG. 1 shows an apparatus according to an exemplary embodiment of the invention.

In the drawings, like reference characters generally refer to the same parts throughout the different views. The drawings are not necessarily to scale, emphasis instead generally being placed upon illustrating the principles of the invention.

Turning now to the drawings, FIG. 1 shows an apparatus 101 according to an exemplary embodiment of the invention. The apparatus 101 includes a laser beam source 103, a control system 105, a measuring circuit 107 and a signal processor 109. The laser beam source 103 is used to radiate a laser beam onto an electronic circuit 111 under test.

The laser beam source 103 is selected to provide incident radiation at a wavelength suitable for the electronic circuit 111 under test. Any suitable laser beam source 103 may be used in the apparatus 101, including, but not limited to, an infrared laser source, an ultraviolet laser source, an X-Ray laser source, a gas laser source, a chemical laser source or a solid-state laser source, for example. As illustrative examples of the infrared laser source, the laser beam source 103 may be a 1340 nm Nd: $YVO_4$ (see for example U.S. Pat. No. 6,897,664), a 1047 nm Nd: YLF or a 1064 nm Nd: YAG. As further illustrative examples of the solid-state laser source, the laser beam source 103 may be a Titanium sapphire laser source (operating wavelengths from 650-1100 nm, for example) or a 1030 nm Yb: YAG. Additionally, as illustrative examples of the gas laser source, the laser beam source 103 may be a 488 nm Argon laser source or a 416 nm Krypton laser source.

The control system 105 is used to control the movement of the laser beam source 103. According to one embodiment of the invention, the control system 105 is operable to move the laser beam source 103 according to a pattern over a plurality of locations on the electronic circuit 111.

In this context, it is noted that as used herewith, the term plurality refers to two or more of the items referred to. For example, a plurality of locations means two or more locations.

The laser beam can be a continuous laser beam or a pulsed laser beam. In the case where a pulsed laser beam is used, the control system 105 may also be operable to switch the laser beam source 103 on or off, according to a desirable frequency of pulsing, in order to provide the pulsed laser beam. The pulsing of the laser beam may be implemented using a beam chopper, such as a chopper wheel, for example.

The laser beam source 103 and the control system 105 may be, but are not limited to, components of a scanning optical microscope, for example. The scanning optical microscope may be a SEMICAPS Private Limited. Model SOM 1005 or other suitable equipment. The SOM 1005 (see for example U.S. Pat. No. 6,897,664) is an integrated multi-laser near infrared scanning optical microscope system which is capable of being used with the Optical Beam Induced Currents (OIC), Single Contact Optical Beam Induced Currents (SCOBIC), Thermal Induced Voltage Alteration (TIVA), Optical Beam Induced Resistance Change (OBIRCH), Laser Induced Voltage Alteration (LIVA), and other related techniques.

The measuring circuit 107 is used to obtain sample measurements of the response signal of the electronic circuit 111 to the stimulus of the laser beam. According to one embodiment of the invention, the response signal output by the electronic circuit is measured using a measuring circuit coupled to the electronic circuit.

Figure 3:
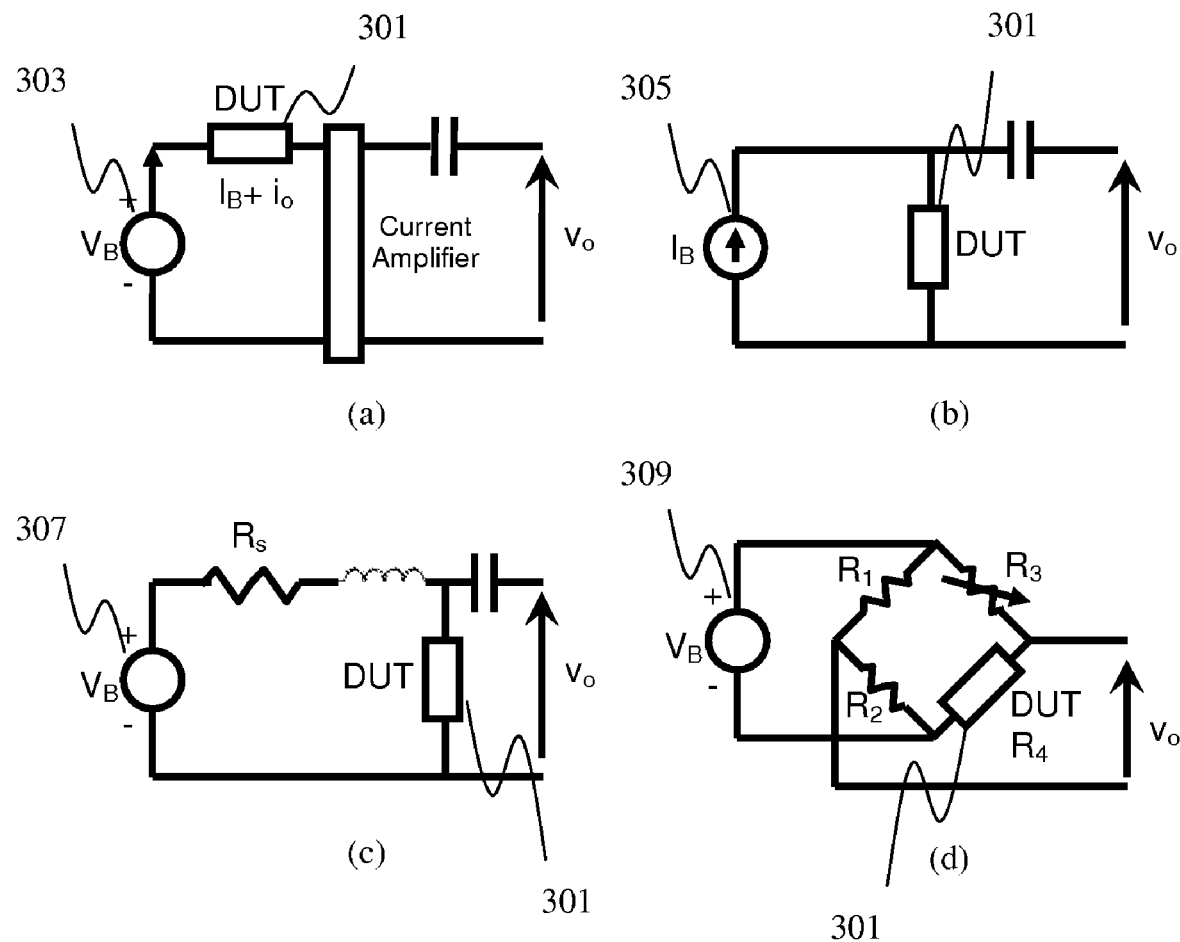
FIG. 3 (a)-(d) shows examples of interface circuits which may be used in a measuring circuit used in embodiments of the method provided by the invention.

The measuring circuit 107 may include an interface circuit which has direct connections to the electronic circuit 111 under test. Illustratively, examples of interface circuits which may be used in the measuring circuit 107 are shown in FIG. 3, and will be discussed in detail later.

The response signal, which is measured using the measuring circuit, may be an electrical voltage, an electrical current, or a combination of them. As such, the measuring circuit 107 may obtain sample values of either the voltage or the current of the response signal.

The signal processor 109 is used to process the sample measurements of the response signal of the electronic circuit 111 under test. In more detail, the signal processor accumulates the plurality of samples to generate a value, and then generate a test result based on the value generated. The signal processor 109 may be implemented on a digital signal processor or a programmable processor, e.g., a microprocessor including complex instruction set computer (CISC) processor or reduced instruction set computer (RISC) processor, for example.

FIG. 1 also shows a digital image 113 of the electronic circuit 111 under test. It can be seen from the digital image 113 of the electronic circuit 111 that there are wires 115 connected to specific locations on the electronic circuit. The wires 115 may be the connection wires from the interface circuit of the measuring circuit 107 coupled to the electronic circuit 111, in order to measure the response signal of the electronic circuit to the stimulus of the laser beam.

The apparatus 101 may also include a display unit 117. The display unit 117 may be used to display the digital image 119 generated as a result of the processing of the sample values of the response signal. In an alternative embodiment, the apparatus 101 does not include an internal display unit 117, but may be connected to an external display unit 117.

As shown in the digital image 119 of FIG. 1, if a fault exists on the electronic circuit 111, it may appear as a bright spot 121, for example.

Figure 2:
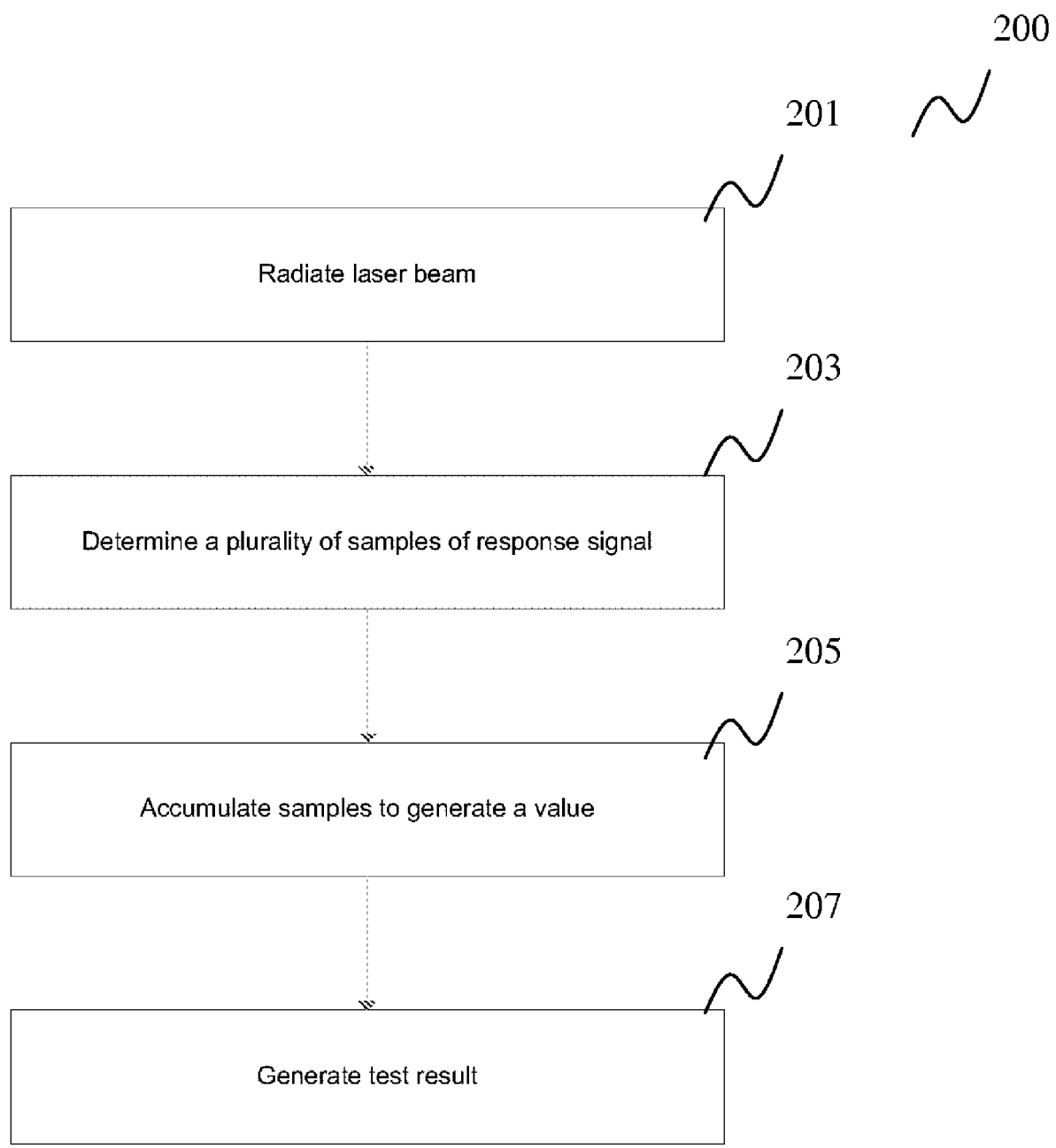
FIG. 2 shows a flow diagram illustrating a method of testing an electronic circuit according to an embodiment of the invention.

FIG. 2 shows a flow diagram 200 illustrating a method of testing an electronic circuit according to an embodiment of the invention. For the purpose of illustration, the method will be described with reference to the apparatus of FIG. 1.

At 201 of FIG. 2, the laser beam is radiated onto the electronic circuit. The control system 105 may be operable to control the movement of the laser beam source 103, so that the laser beam may be radiated on specific locations on the electronic circuit as desired.

As such, according to one embodiment, the method may further include directing the laser beam to dwell on a first location on the electronic circuit. In one embodiment, the first location of the electronic circuit corresponds to a pixel location of the digital image of the electronic circuit.

Further, according to another embodiment of the invention, the method provided may further include directing the laser beam to dwell on a second location on the electronic circuit. In this embodiment, the second location of the electronic circuit corresponds to another pixel location of the digital image of the electronic circuit.

According to yet another embodiment of the invention, the method provided may further include directing the laser beam to dwell on locations on the electronic circuit according to a pattern including a plurality of locations on the electronic circuit.

The duration which the laser beam dwells on the first location (and alternatively also on the second location of the electronic circuit), or the dwell time, may be controlled. This is suitable to allow the measuring circuit 107 and the signal processor 109 have sufficient time to obtain and process at least two samples of the response signal at the said location, before the laser beam is moved to the next location of the electronic circuit.

At 203 of FIG. 2, a plurality of samples of the response signal output by the electronic circuit is determined during the period when the laser beam is radiated. The determining of the plurality of samples may be performed using the measuring circuit 107.

At 205 of FIG. 2, the plurality of samples is accumulated to generate a value. The accumulating of the plurality of samples will be discussed in more detail in relation to FIG. 6 later.

At 207 of FIG. 2, the method provided includes generating a test result based on the value generated. When generating a test result based on the value generated, a digital image of the electronic circuit may be generated first, wherein a location of the electronic circuit corresponds to a pixel location of the digital image of the electronic circuit, as mentioned earlier.

The method may further include generating a digital image of the electronic circuit using the value generated at the first location of the electronic circuit. In one embodiment, the value generated is a pixel value (e.g., the brightness of the pixel) of a digital image.

The digital image of the electronic circuit generated may then be analyzed, using visual inspection, for example. According to one embodiment of the invention, if there were a fault on the electronic circuit, the fault at a location on the electronic circuit may appear as a bright spot, a bright line or a bright area on the corresponding pixel location of the digital image of the electronic circuit.

If one or more bright spots, lines or areas appear on the digital image of the electronic circuit generated, then the electronic circuit has one or more faults, and thus, a negative test result is obtained (i.e., the electronic circuit is faulty). If no bright spot, line or area appears on the digital image of the electronic circuit, then the electronic circuit does not have a fault and thus, a positive test result is obtained (i.e., the electronic circuit is not faulty).

FIG. 3 (a)-(d) shows examples of interface circuits which may be used in a measuring circuit used in embodiments of the method provided by the invention. In all the example interface circuits shown in FIG. 3, the electronic circuit under test is referred to as the device under test (DUT) 301.

FIG. 3(a) shows an interface circuit used in the Optical Beam Induced Resistance Change (OBIRCH) technique. The OBIRCH interface circuit operates on a voltage biasing and a current measuring approach. This interface circuit includes a constant voltage source 303. In an exemplary embodiment for a measuring circuit using the infrared laser OBIRCH (IR-OBIRCH) interface circuit, a Hewlett Packard E3614A voltage source may be used as the constant voltage source.

FIG. 3(b) shows an interface circuit used in the Thermal Induced Voltage Alteration (TIVA) technique. The TIVA interface circuit operates on a current biasing and a voltage measuring approach. This interface circuit includes a constant current source 305. In an exemplary embodiment for a measuring circuit using the TIVA interface circuit, a Keithley Model 2420 source measurement unit may be used in a constant current mode.

FIG. 3(c) shows an interface circuit used in the Thermal Beam Induced Phenomenon (TBIP) and the Externally Induced Voltage Alteration (XIVA) techniques. The TBIP-XIVA interface circuit operates on a voltage biasing and a voltage measuring approach. This interface circuit may include a constant voltage source 307.

FIG. 3(d) shows an interface circuit used in the Differential Resistance Measurement (DReM) technique. The DReM interface circuit operates on a voltage biasing and a voltage measuring approach. This interface circuit may include a constant voltage source 309.

As shown in FIG. 3(d), the DReM interface circuit has a bridge configuration, which acts as a voltage rectifier. The output voltage $V_o$ has a value which always greater than or equal to zero, i.e., a direct-current (d.c.) voltage. Therefore, the DReM interface circuit is also referred to as a d.c. coupled interface circuit.

Unlike the DReM interface circuit, the other interface circuits shown in FIG. 3(a), FIG. 3(b) and FIG. 3(c) do not have a bridge configuration or any voltage rectifying circuitry. As such, they are all alternating current (a.c.) coupled interface circuits. In this regard, the output voltage $V_o$ for these interface circuits may have a positive value or a negative value.

Figure 4:
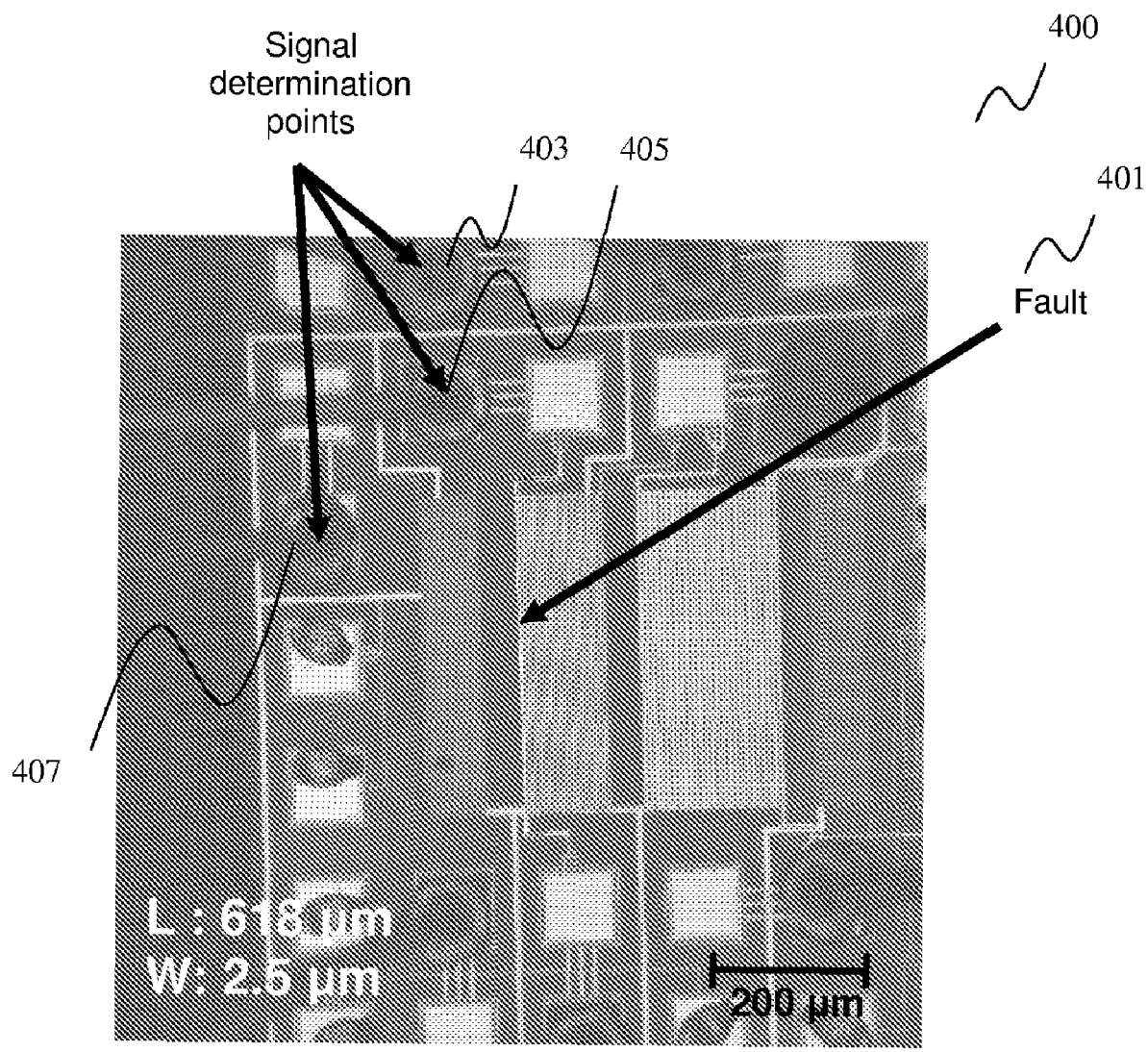
FIG. 4 shows a digital image of an electronic circuit that is tested in an illustrative embodiment of the invention.

FIG. 4 shows a digital image 400 of an electronic circuit that is tested in an illustrative embodiment of the invention.

In this example for illustrative purposes, the electronic circuit with a known fault 401 is used. This fault 401 is reflected in the digital image 400. When a laser beam is radiated on the location of the fault on the electronic circuit, the electronic circuit at the location of the fault 401 will be stimulated, and the response signal to the stimulus from the laser beam may be measured. The measured response signals will be subsequently discussed with reference to FIGS. 5, 6, 7, 8 and 9.

Additionally, FIG. 4 also shows the pads on the electronic circuit, labeled as 403, 405 and 407 respectively. These pads may be the locations on the electronic circuit, at which the measuring circuit (for measuring the response signal output by the electronic circuit) is coupled to the electronic circuit, according to an embodiment of the invention.

The location on the electronic circuit at which the measuring circuit is coupled to the electronic circuit may be any location on the electronic circuit. This location on the electronic circuit may be, but is not limited to, a power supply pad, a ground pad and a signal pad, for example.

FIG. 5 (a)-(f) shows a set of graphs of a response signal of the electronic circuit shown in FIG. 4 as a result of the stimulus of the pulsed laser beam according to an embodiment of the invention.

Figure 5A:
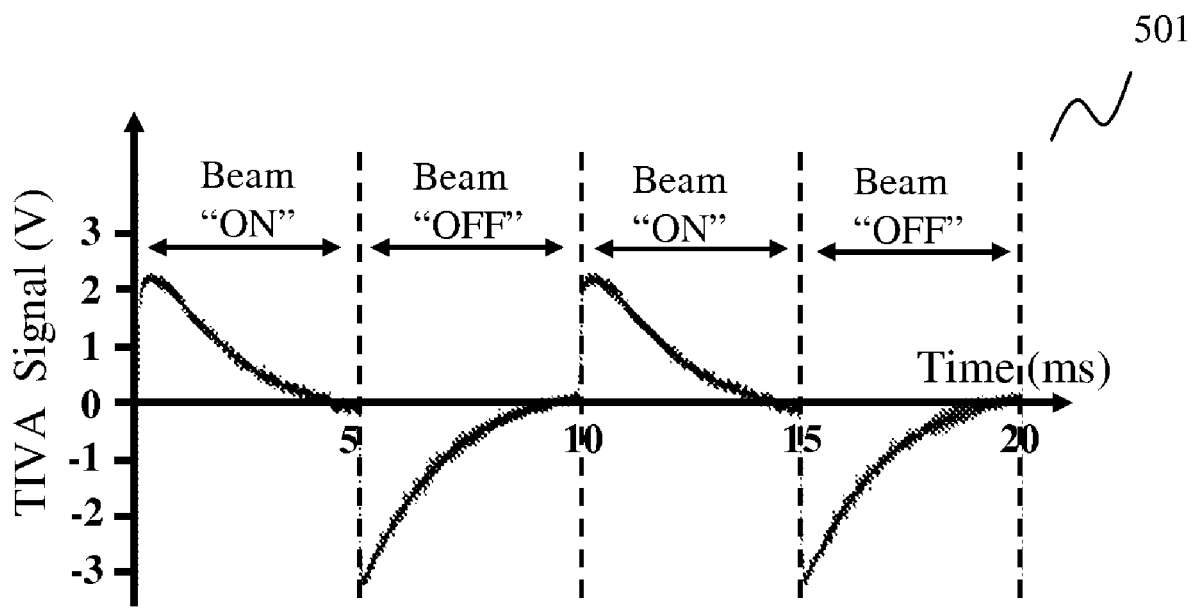
FIG. 5 (a)-(f) shows a set of graphs of a response signal of the electronic circuit shown in FIG. 4 as a result of the stimulus of the pulsed laser beam according to an embodiment of the invention.
Figure 5B:
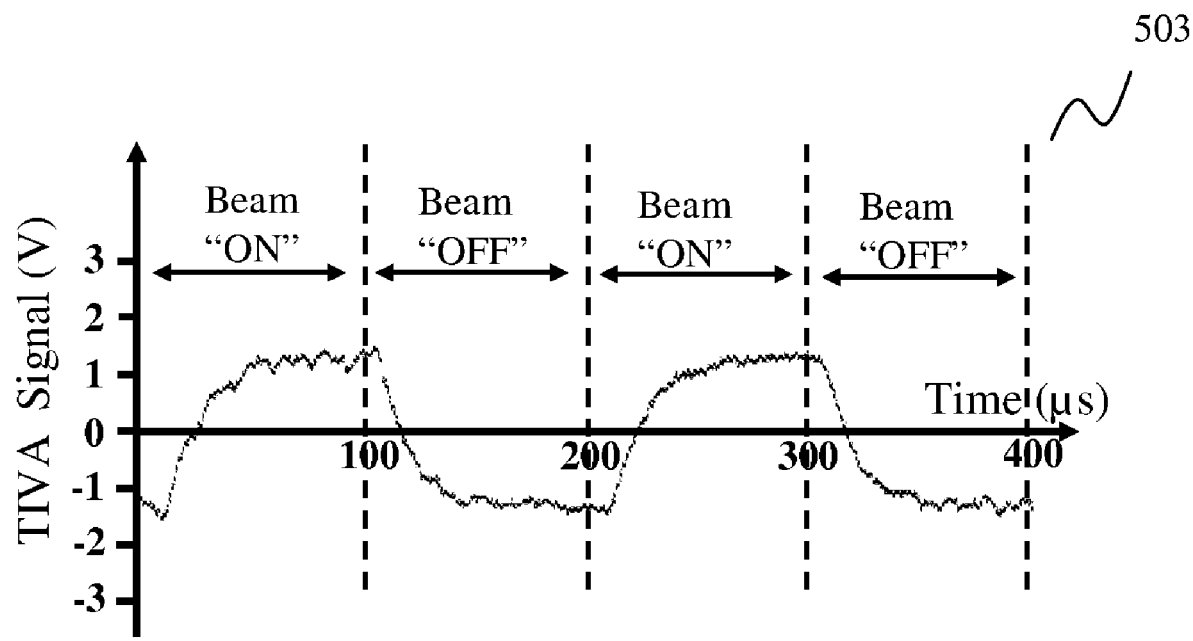
Figure 5C:
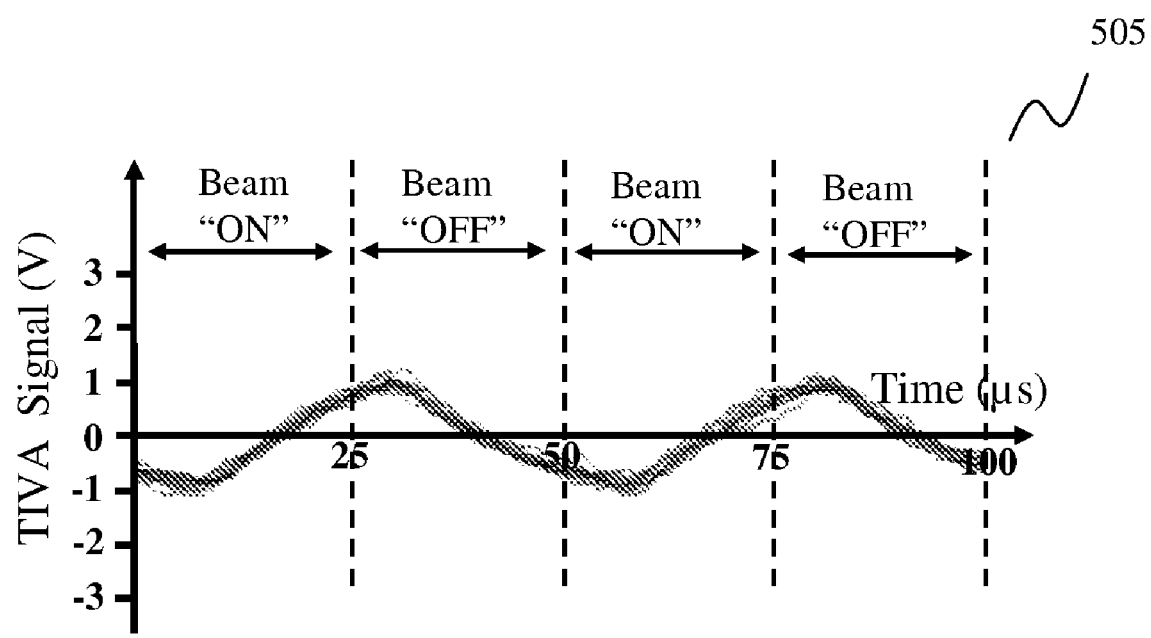

The graphs in FIGS. 5(a), 5(b) and 5(c) show the response signal obtained using a TIVA interface circuit (as described earlier in relation to FIG. 3(b)), with the laser beam being pulsed at a frequency of 100 Hz, 5 kHz and 20 kHz, respectively (each graph labeled as 501, 503 and 505 respectively).

Further, as shown in FIG. 5(b), during the period when the laser beam is radiating (or radiating period), the response signal takes a positive value only after a delay from the start of the radiating period. Similarly, during the period when the laser beam is not radiating (or non-radiating period), the response signal takes a negative value only after a delay from the start of the non-radiating period. This same observation is also seen in FIG. 5(c) as well.

While comparing the graphs in FIGS. 5(a), 5(b) and 5(c) with one another, it can be seen that with a higher frequency of pulsing the laser beam, the delay in the response signal becomes larger. It can also be seen that the maximum value of the amplitude of the response signal decreases with a higher frequency of pulsing the laser beam. This means that the response signal suffers a higher attenuation with a higher frequency of pulsing of the laser beam. Further, it can be seen that the value of the signal accumulation over a pulsed period is larger than a single value on any of the graphs of FIGS. 5(a), 5(b) and 5(c).

Figure 5D:
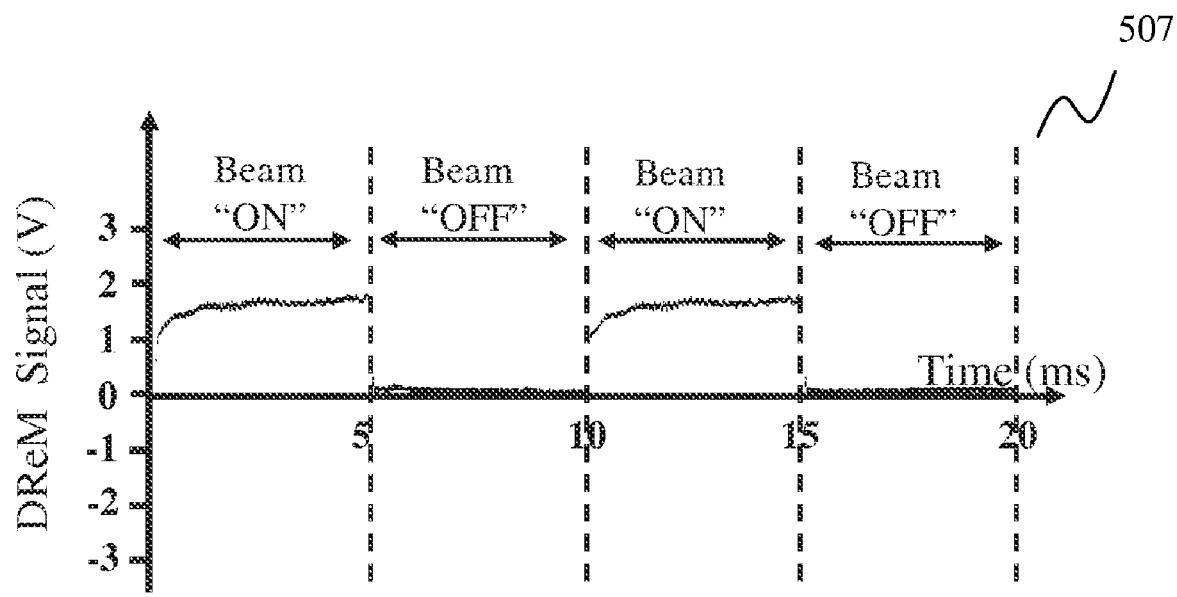
Figure 5E:
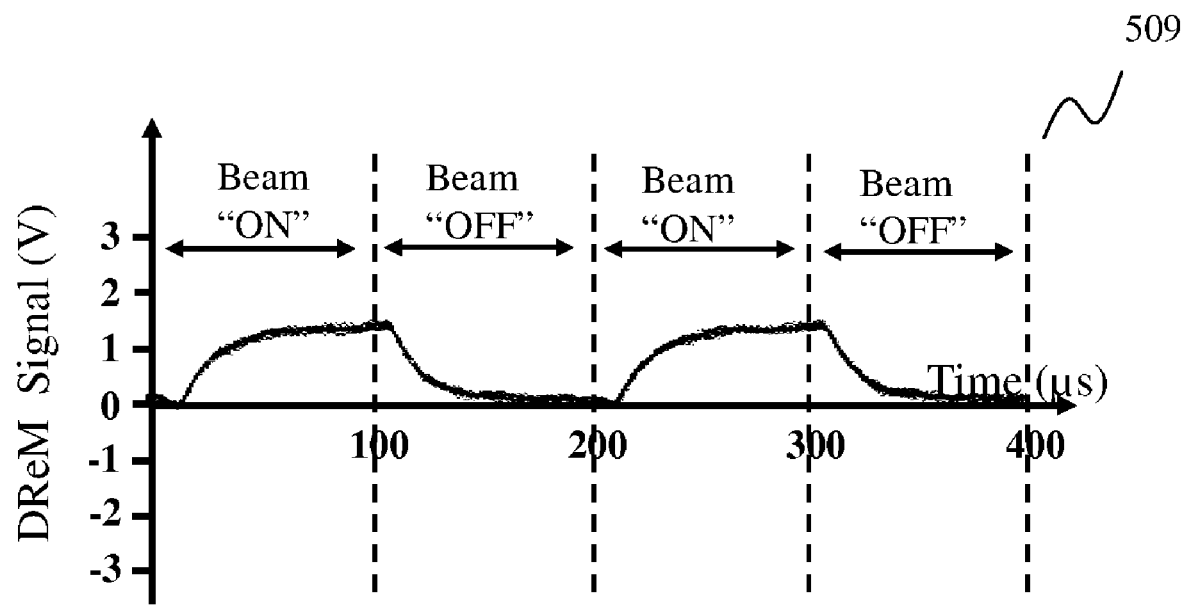
Figure 5F:
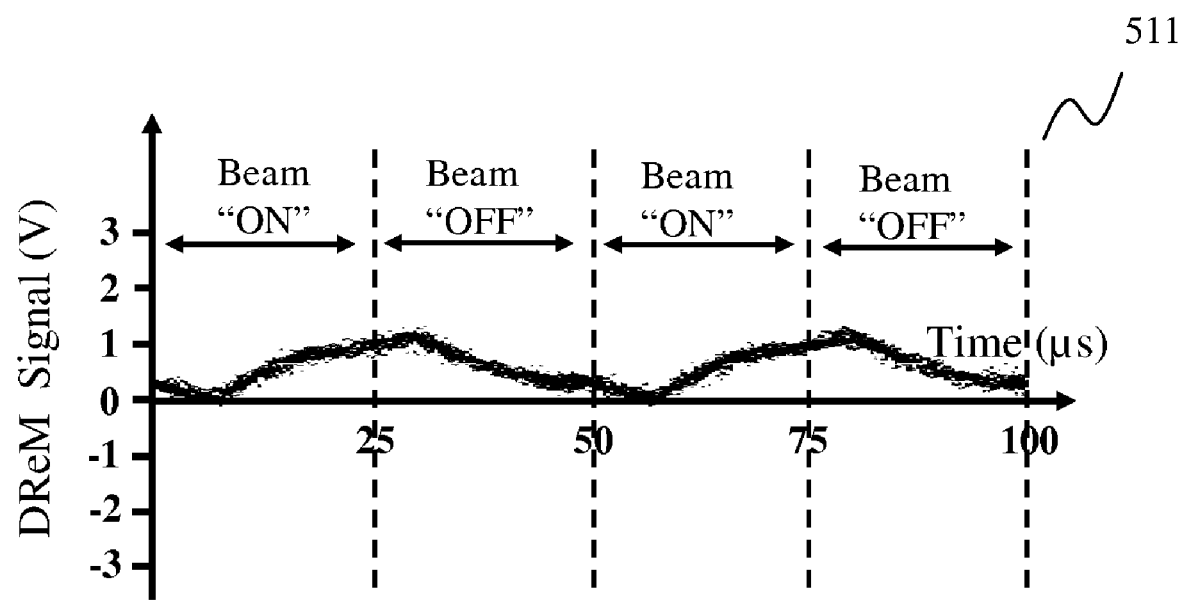

The graphs in FIG. 5(d), 5(e) and 5(f) show the response signal obtained using a DReM interface circuit (as described earlier in relation to FIG. 3(d)), with the laser beam being pulsed at a frequency of 100 Hz, 5 kHz and 20 kHz, respectively (each graph labeled as 507, 509 and 511 respectively).

The observations made with regard to the graphs of FIGS. 5(a), 5(b) and 5(c) apply to the graphs in FIGS. 5(d), 5(e) and 5(f) as well, namely
  a) the delay in the response signal becomes larger with a higher frequency of pulsing the laser beam,
  b) the response signal suffers a higher attenuation with a higher frequency of pulsing of the laser beam, and
  c) the value of the signal accumulation over a pulsed period is larger than a single value.

In view of the delay in the response signal becoming larger with a higher frequency of pulsing used, the accumulating of the plurality of samples may be performed after a predetermined time delay from the start of the period when the laser beam is radiated. In such an embodiment, it may be taken into account that due to the frequency of pulsing selected for the pulsing laser beam being above a predetermined frequency of pulsing threshold (as shown earlier), there is a time delay before the response signal of the electronic circuit appears with respect to the start of the period when the laser beam is radiated. With this approach, a higher processing gain may be achieved.

Alternatively, it is also possible to accumulate the plurality of samples from the start of the period when the laser beam is radiated (i.e., without any time delay). In this embodiment, it may be taken into account that if the frequency of pulsing selected for the pulsing laser beam is below a predetermined frequency of pulsing threshold (as shown earlier), the response signal of the electronic circuit appears at the start of the period when the laser beam is radiated (i.e., there is no or a negligible time delay, unlike in the embodiment mentioned earlier).

Figure 6:
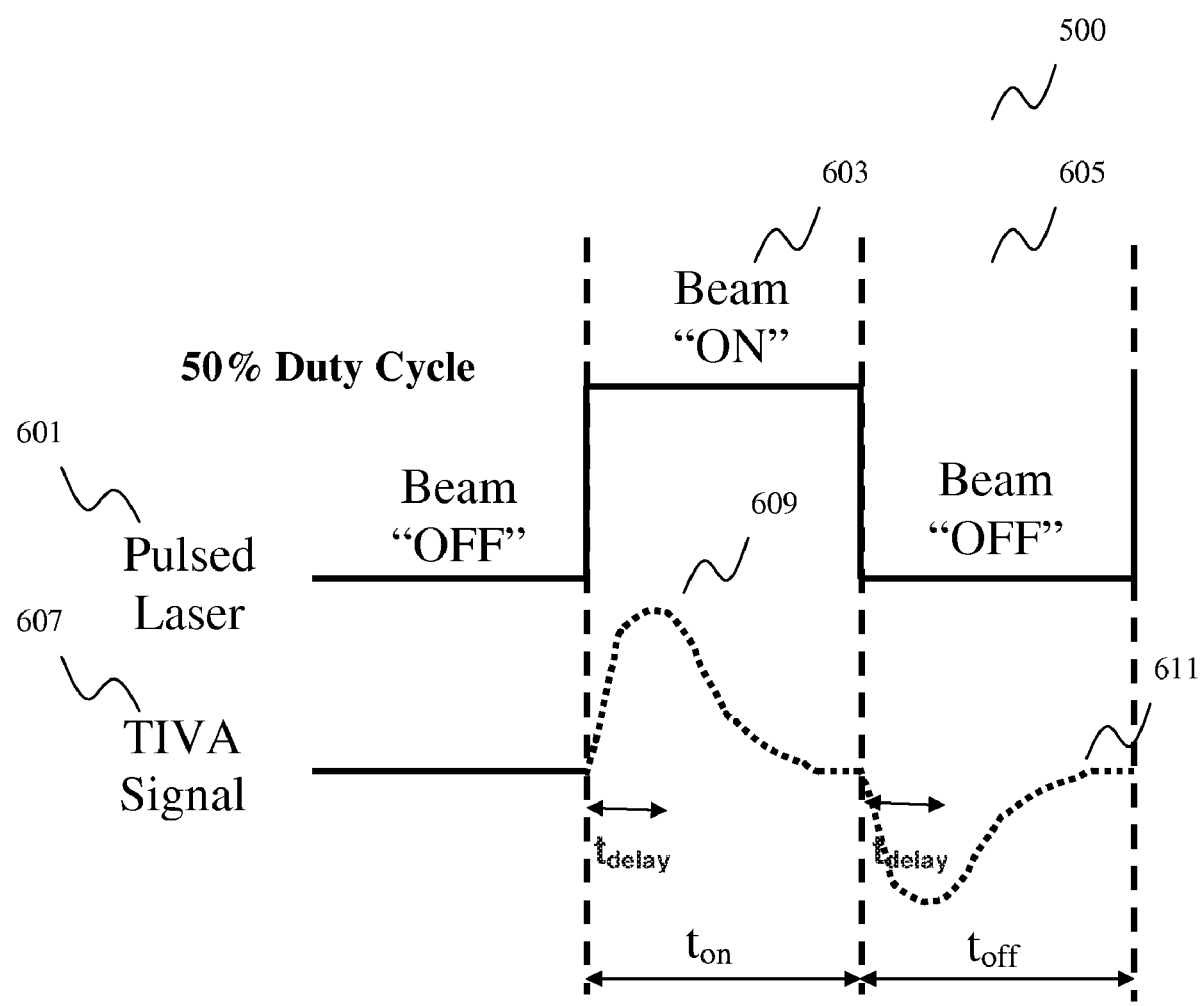
FIG. 6 shows an illustration of the processing of a response signal according to an exemplary embodiment of the invention.

FIG. 6 shows an illustration 600 of the processing of a response signal, according to an exemplary embodiment of the invention. Graph 601 shows an example of the pulsed laser beam signal, wherein the laser beam is controlled to be either radiating (ON) or non-radiating (OFF). The period when the laser beam is radiating, $t_{ON}$, is labeled as 603 and the period when the laser beam is not radiating, $t_{OFF}$, is labeled as 605.

Graph 607 shows a sampled response signal obtained using a TIVA coupled interface. It can be seen that the sampled response signal during the period when the laser beam is radiating, $t_{ON}$ (603), 609, has a value greater or equal to 0, and the sampled response signal during the period when the laser beam is not radiating, $t_{OFF}$ (605), 611, has a value less than or equal to 0.

In this embodiment, for the dwell time, $T_d$, the frequency of pulsing of the laser beam is selected to be $$f_{pulsing} = \frac{1}{T_d} \quad (1)$$

In this regard, if a 50% duty cycle is assumed, this means that the period when the laser beam is radiating (or radiating period), $t_{ON}$ (603), is the same as the period when the laser beam is not radiating (or non-radiating period), $t_{OFF}$ (605), i.e., $t_{ON}=t_{OFF}=0.5\ T_d$, as shown in FIG. 6.

The period when the laser beam is not radiated may a time period after the period when the laser beam is radiated. Illustratively, the period when the laser beam is not radiated may be a time period directly after the period when the laser beam is radiated.

With regard to the response signal of the electronic circuit to the stimulus of the pulsed laser beam, the response signal 607 is measured and sampled according to a frequency of sampling. In one embodiment, the frequency of sampling of the response signal is in the range from about 100 kHz to about 80 MHz, for example, from about 5 MHz to about 30 MHz. In one illustrative example, the frequency of sampling may be selected as about 20 MHz.

Further, according to one embodiment of the invention, the frequency of sampling of the response signal is higher than the frequency of the pulsed laser beam. The frequency of the pulsed laser beam may be selected from a range of frequencies, for example, in the range from about 50 Hz to about 50 kHz. In an illustrative example, the frequency of pulsing may be selected as about 5 KHz.

With regard to error tolerance, it should be noted here that present invention has the advantage that it provides for a high error tolerance for the frequency of pulsing, provided that the frequency of pulsing selected is different from the frequency of the primary noise. As a further advantage, the frequency of sampling also has a high error tolerance, in particular when the frequency of sampling selected is at least 5 to 10 times higher than the selected frequency of pulsing.

In this illustrative example, with the frequency of sampling being selected as about 20 MHz and the frequency of pulsing being selected as about 5 KHz, there would be about 4000 sample values obtained, with about 2000 sample values during the radiating period and about 2000 sample values during the non-radiating period.

Illustratively, each sample value is processed and converted based on a predetermined scale. In one embodiment, the predetermined scale is the grayscale intensity scale. In such an embodiment, each sample value is converted to a value representing the brightness at the corresponding pixel location on the digital image.

During the period when the laser beam is radiating (or radiating period), $t_{ON}$ (603), the converted sample values are accumulated in order to generate a value. This value is subsequently used to generate a test result.

Further, according to one embodiment of the invention, another plurality of samples of another response signal output by the electronic circuit during a period when the laser beam is not radiated is determined. The other plurality of samples is then accumulated to generate another value, and the test result is generated based on the value and the other value.

In other words, during the non-radiating period, $t_{OFF}$ (605), the converted sample values are accumulated in order to generate another value. The test result is then generated based on the value and the other value.

According to one embodiment, the generation of the test result includes subtracting the other value from the value. It is however also possible to add the other value to the value in the method provided by the present invention.

In more detail, referring for purely illustrative purposes to the example of FIG. 6, for the case of a d.c. coupled interface circuit, there is essentially no difference whether the other value is subtracted from or added to the value. This is because for the non-radiating period, the measured signal is at a value of the d.c. level and for the radiating period, the measured signal has a higher value. Thus, it is equally possible to either subtract or add the other value from/to the value in practical applications. For ease of software implementation, the subtraction of the other value from the value may be performed for both the d.c. coupled interface circuit and the a.c. coupled interface circuit. It is apparent to the person skilled in the art that the consideration equally applies to other embodiments, when the other value is either added or subtracted.

In the embodiment where the other value is subtracted, the brightness (or the signal intensity) at the corresponding pixel location on the digital image is represented by the value and the other value, and may be computed using the following equation:

$$I(x_i, y_i) = \frac{1}{N}\sum_{n=1}^{N}\sum_{m=1}^{M} S_{(x_i,y_i)}(t) * \delta[t - (T_{PD} + nmT_S)] - \quad (2)$$
$$S_{(x_i,y_i)}(t) * \delta[t - (T_{DT} + T_{PD} + nmT_S)]$$

where $I(x_i, y_i)$ is the signal intensity at the pixel with the coordinates $(x_i, y_i)$ of the digital image, $S_{(x_i,y_i)}(t)$ is the measured response signal of the electronic circuit to the stimulus of the pulsed laser beam radiation onto the location of the electronic circuit with the coordinates $(x_i, y_i)$, N is the number of pulses of laser beam radiated onto each pixel location, $T_{PD}$ is the time delay applied before the process of accumulating the converted samples is carried out, $T_{DT}$ is the laser beam dwell time for each pulse, $T_S$ is the sampling period, and M is the number of samples accumulated, given by $$M = \frac{T_{DT} - T_{PD}}{T_S} \quad (3)$$

It can be seen from the above equation that the value generated (from the plurality of samples obtained during the radiating period, $t_{ON}$(603)) is represented by the accumulation of the term $S_{(x_i,y_i)}(t)*\delta[t-(T_{PD}+nmT_S)]$. The other value generated (from the plurality of samples obtained during the non-radiating period, $t_{OFF}$(605)) is represented by the accumulation of the term $S_{(x_i,y_i)}(t)*\delta[t-(T_{DT}+T_{PD}+nmT_S)]$.

Figure 7:
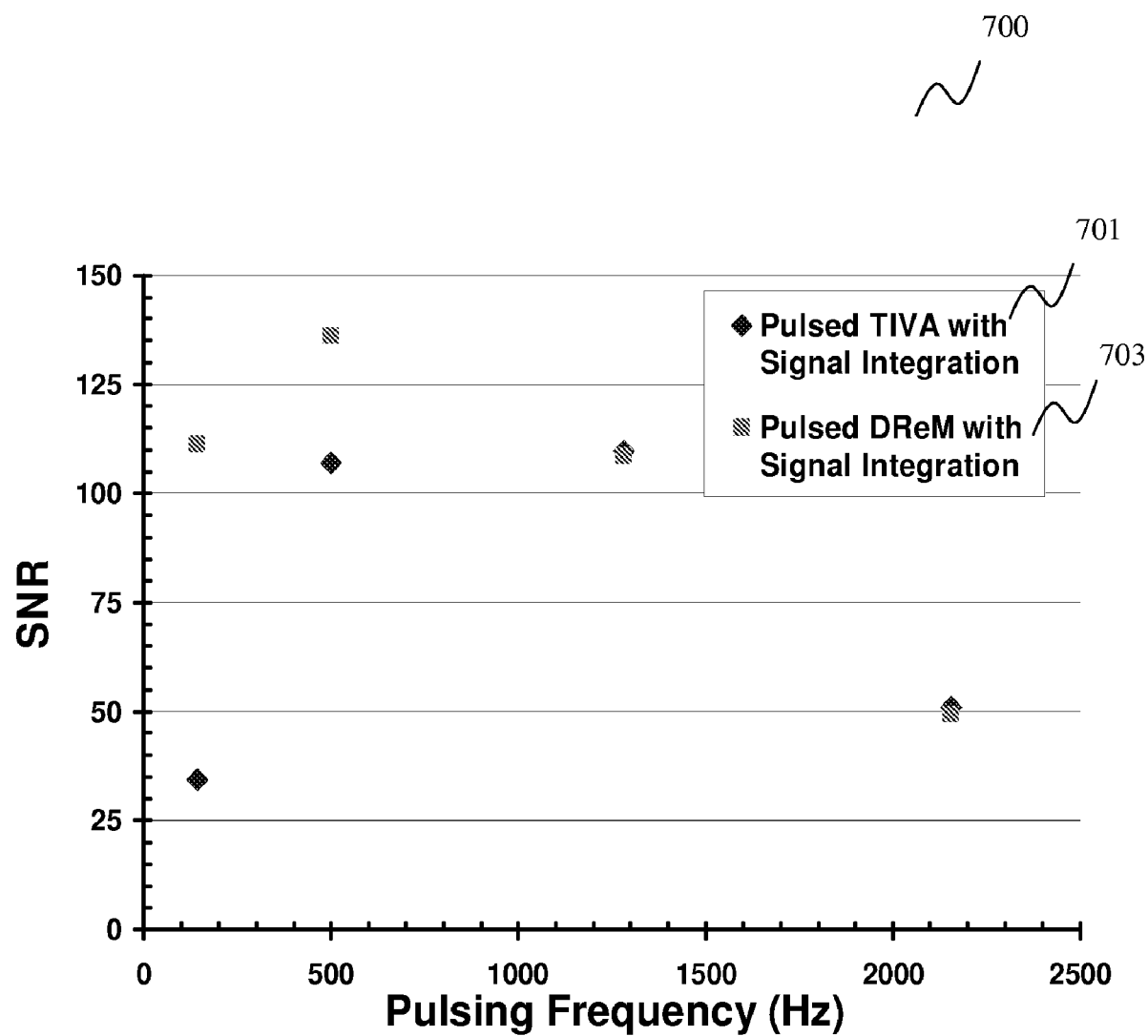
FIG. 7 shows a graph on the performance results of the electronic circuit which was tested in two exemplary embodiments of the invention over a range of frequencies of pulsing of the pulsed laser used.

FIG. 7 shows a graph 700 on the performance results of the electronic circuit which was tested in two exemplary embodiments of the invention over a range of frequencies of pulsing of the pulsed laser used.

In FIG. 7, the graph showing the performance results for the first exemplary embodiment which uses the TIVA interface circuit is labeled as 701 while the graph showing the performance results for the second exemplary embodiment which uses the DReM interface circuit is labeled as 703.

It can be seen from both graphs 701 and 703 that a gain of roughly 100 dB in signal to noise ratio (SNR) may be obtained for both embodiments, for the range of frequencies of pulsing from 400 Hz to 1500 Hz. Further, it can also be seen from graph 703 that when a low frequency of pulsing is used (for example, less than 400 Hz), a gain in SNR of about 100 dB may be obtained using the embodiment with the DReM interface circuit.

FIG. 8 shows a table comparing the performance results of the electronic circuit which was tested in two exemplary embodiments of the invention against the performance results of the electronic circuit which was tested using two conventional methods.

By comparing rows 1 and 2 of the table of FIG. 8 (i.e., comparing the performance results of one exemplary embodiment of the invention, wherein a TIVA interface circuit is used, against that of a conventional method using a TIVA interface circuit), it can be seen that a gain in signal-to-noise ratio (SNR) of about 102 dB may be achieved by using the embodiment of the invention with the TIVA interface circuit.

Similarly, by comparing rows 3 and 4 of the table of FIG. 8 (i.e., comparing the performance results of one exemplary embodiment of the invention, wherein a DReM interface circuit is used, against that of a conventional method using a DReM interface circuit), it can be seen that a gain in SNR of about 122 dB may be achieved by using the embodiment of the invention with the DReM interface circuit.

FIG. 9 (a)-(d) shows a set of digital images of an electronic circuit that had been tested using an exemplary embodiment of the invention.

Figure 9A:
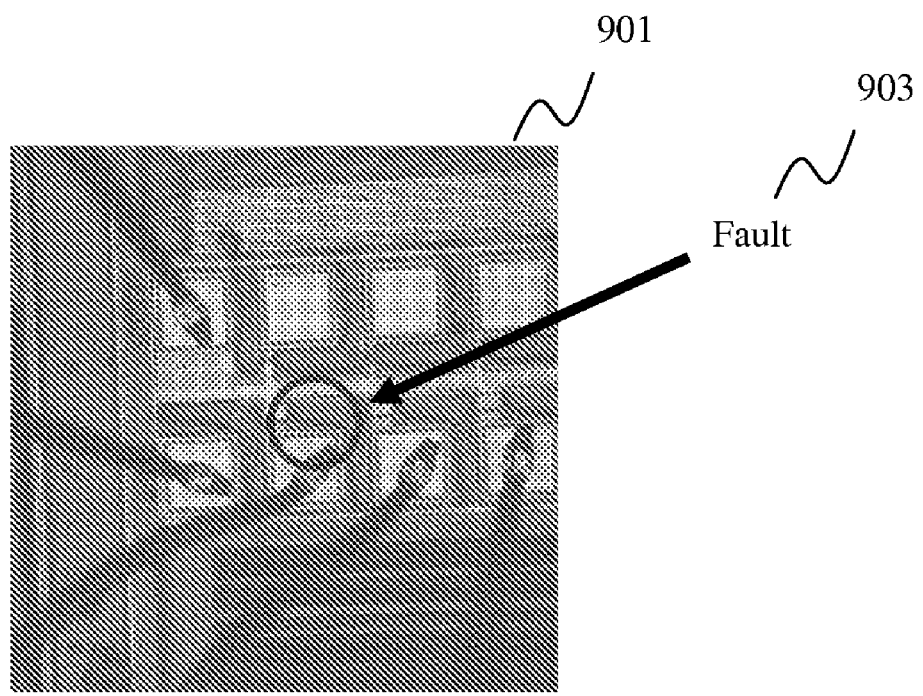
FIG. 9 (a)-(d) shows a set of digital images of an electronic circuit that had been tested in an exemplary embodiment of the invention.

FIG. 9(a) shows the digital image 901 of the electronic circuit, with a known fault 903.

Figure 9B:
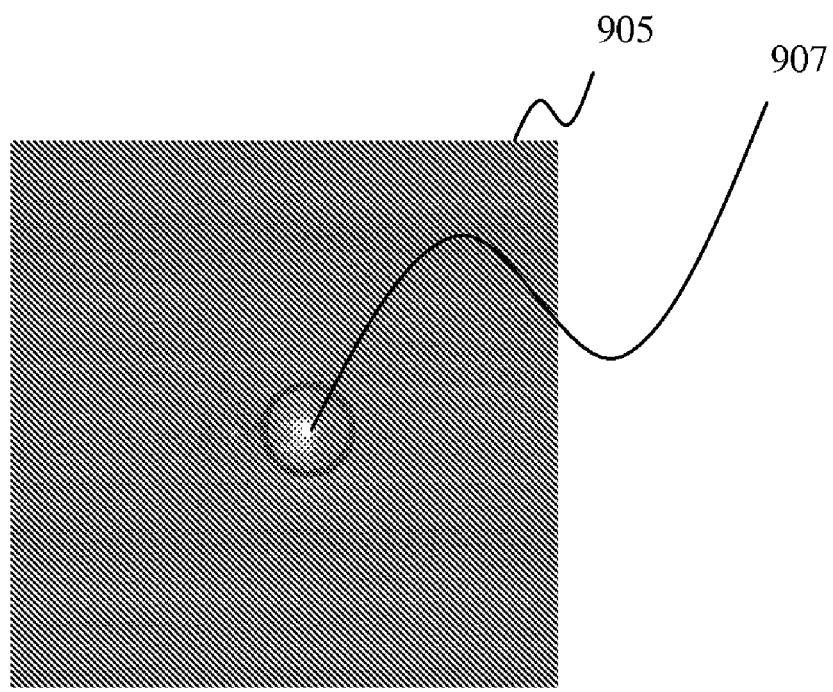

FIG. 9(b) shows the digital image 905 of the electronic circuit obtained with the conventional method using a DReM interface circuit, with the pulse laser beam operating at the power level of 10 mW. In the digital image of FIG. 9(b), the known fault may be clearly seen (907).

Figure 9C:
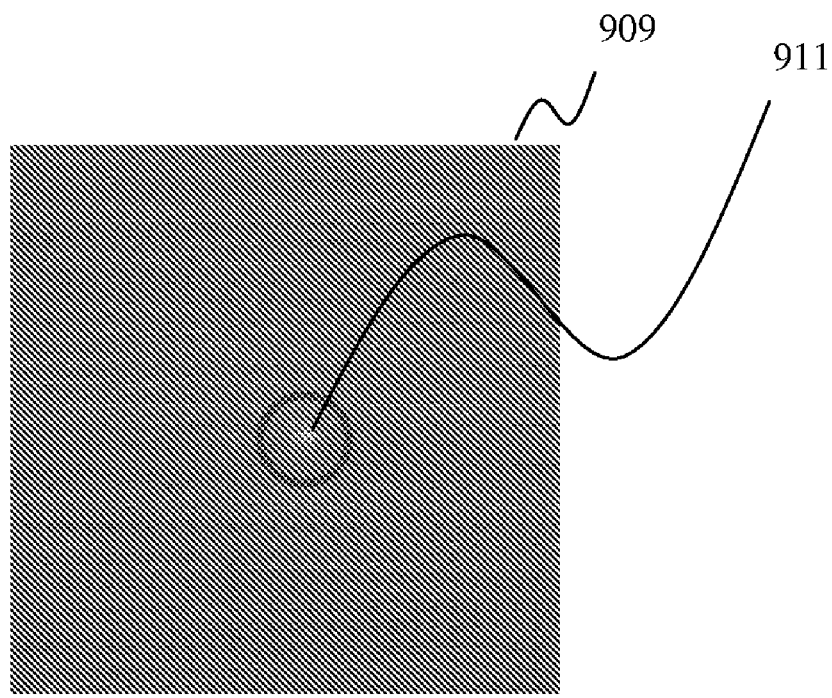

FIG. 9(c) shows the digital image 909 of the electronic circuit obtained with a conventional method using a DReM interface circuit, with the pulse laser beam operating at the power level of 1.8 mW. At this lower power level of the pulsed laser beam, it can be seen that the known fault 911 is barely visible in the digital image shown in FIG. 9(c).

Figure 9D:
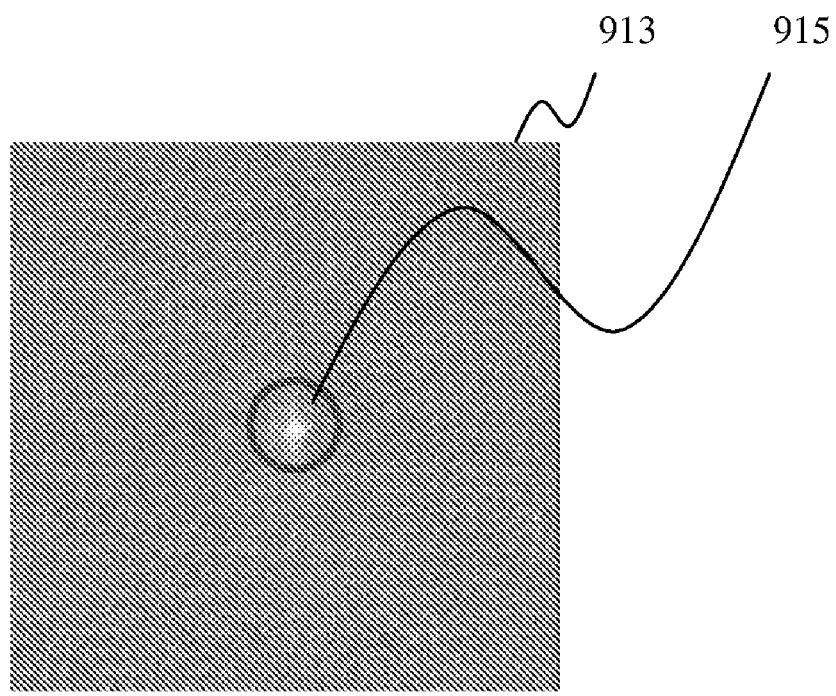

FIG. 9(d) shows the digital image 913 of the electronic circuit obtained with an exemplary embodiment of the invention using a DReM interface circuit, with the pulse laser beam operating at the power level of 1.8 mW. It can be seen that even at this lower power level of the pulsed laser beam, the known fault 915 may be clearly seen in the digital image shown in FIG. 9(d).

In comparing the digital images shown in FIG. 9(b) and FIG. 9(d), despite using a lower laser beam power to generate the digital image of FIG. 9(d) (the laser beam power used in order to generate the digital images in FIG. 9(b) and FIG. 9(d) are 10 mW and 1.8 mW respectively), the known fault may be clearly seen in both these digital images. Therefore, as shown in FIG. 9, by using this exemplary embodiment of the invention, the detection sensitivity of conventional laser induced techniques is improved without having to increase the power of the laser beam used.

Further, it should be noted that a lock-in amplifier is not used in this exemplary embodiment of the invention used in order to generate the digital image of FIG. 9(d). Since the lock-in amplifier is not used in this exemplary embodiment of the invention, the difficulties arising from the requirement of accurate calibration and fine control of parameters associated with the use of a lock-in amplifier described earlier are avoided.

The method provided by the present invention has the following advantages.

Firstly, with the method provided by the present invention, the detection sensitivity of conventional laser induced techniques is improved without having to increase the power of the laser beam used.

Secondly, the method provided by the present invention offers an alternative approach to improve the detection sensitivity of these conventional laser induced techniques where a lock-in amplifier is not used.

Since a lock-in amplifier is not used, the difficulties arising from the requirement of accurate calibration and fine control of parameters associated with the use of a lock-in amplifier are avoided in embodiments of the invention. Accordingly, embodiments of the invention may be easily implemented in a real-time integrated circuit testing environment.

The embodiments which are described in the context of the method of testing an electronic circuit are analogously valid for the apparatus, and vice versa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of testing an electronic circuit, comprising:
   radiating a laser beam onto the electronic circuit,
   determining a plurality of samples of a response signal output by the electronic circuit during the period when the laser beam is radiated,
   accumulating the plurality of samples to generate a value, and
   generating a test result based on the value.

2. The method of claim 1, wherein the response signal output by the electronic circuit is measured using a measuring circuit coupled to the electronic circuit.

3. The method of claim 2, wherein the location on the electronic circuit at which the measuring circuit is coupled to the electronic circuit is selected from a group consisting of a power supply pad, a ground pad and a signal pad.

4. The method of claim 1, wherein the laser beam is a pulsed laser beam.

5. The method of claim 4, wherein the frequency of sampling of the response signal is higher than the frequency of the pulsed laser beam.

6. The method of claim 4, wherein the frequency of the pulsed laser beam is in the range from about 50 Hz to about 50 kHz.

7. The method of claim 4, wherein the frequency of sampling of the response signal is in the range from about 100 kHz to about 80 MHz.

8. The method of claim 1, wherein accumulating the plurality of samples is performed after a predetermined time delay from the start of the period when the laser beam is radiated.

9. The method of claim 1, wherein accumulating the plurality of samples is performed from the start of the period when the laser beam is radiated.

10. The method of claim 1, further comprising
directing the laser beam to dwell on a first location on the electronic circuit.

11. The method of claim 10, further comprising
directing the laser beam to dwell on a second location on the electronic circuit.

12. The method of claim 10, further comprising
directing the laser beam to dwell on locations on the electronic circuit according to a pattern comprising a plurality of locations on the electronic circuit.

13. The method of claim 10, further comprising
generating a digital image of the electronic circuit using the value generated at the first location of the electronic circuit.

14. The method of claim 13, wherein the first location of the electronic circuit corresponds to a pixel location of the digital image.

15. The method of claim 13, wherein the value generated is a pixel value of a digital image.

16. The method of claim 1, wherein the response signal is at least one of an electrical voltage signal and an electrical current signal.

17. The method of claim 1, wherein another plurality of samples of another response signal output by the electronic circuit during a period when the laser beam is not radiated is determined, the other plurality of samples is accumulated to generate another value and the test result is generated based on the value and the other value.

18. The method of claim 17, wherein the generating of the test result comprises subtracting the other value from the value.

19. The method of claim 1, wherein the period when the laser beam is not radiated is a time period after the period when the laser beam is radiated.

20. The method of claim 1, wherein the period when the laser beam is not radiated is a time period directly after the period when the laser beam is radiated.

21. An apparatus, comprising:
a laser beam source, wherein the laser beam source radiates a laser beam onto the electronic circuit,
a control system operable to direct the laser beam source to dwell on a location on the electronic circuit,
a measuring circuit, wherein the measuring circuit determines a plurality of samples of a response signal output by the electronic circuit during the period when the laser beam is radiated, and
a signal processor, wherein the signal processor
accumulates the plurality of samples to generate a value, and
generates a test result based on the value.

22. The apparatus of claim 21, wherein the control system is operable to move the laser beam source according to a pattern over a plurality of locations on the electronic circuit.

23. The apparatus of claim 21, wherein the laser beam is a pulsed laser beam.

24. The apparatus of claim 23, wherein the frequency of sampling is higher than the frequency of the pulsed laser beam.

25. The apparatus of claim 23, wherein the frequency of the pulsed laser beam is in the range from about 50 Hz to about 50 kHz and the frequency of sampling is in the range from about 100 kHz to about 80 MHz.

* * * * *